US012727215B2

(12) United States Patent
Park et al.

(10) Patent No.: US 12,727,215 B2
(45) Date of Patent: Sep. 1, 2026

(54) BOUNDARY GATE STRUCTURE FOR DIFFUSION BREAK IN 3D-STACKED SEMICONDUCTOR DEVICE

(71) Applicant: SAMSUNG ELECTRONICS CO., LTD., Suwon-si (KR)

(72) Inventors: Saehan Park, Clifton Park, NY (US); Panjae Park, Clifton Park, NY (US); Seungyoung Lee, Clifton Park, NY (US); Byounghak Hong, Latham, NY (US); Gunho Jo, Niskayuna, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 941 days.

(21) Appl. No.: 17/988,485

(22) Filed: Nov. 16, 2022

(65) Prior Publication Data

US 2023/0343825 A1 Oct. 26, 2023

Related U.S. Application Data

(60) Provisional application No. 63/335,081, filed on Apr. 26, 2022.

(51) Int. Cl.
*H01L 29/06* (2006.01)
*H01L 23/48* (2006.01)
(Continued)

(52) U.S. Cl.
CPC ....... *H10D 62/121* (2025.01); *H10D 30/6757* (2025.01); *H10D 62/151* (2025.01);
(Continued)

(58) Field of Classification Search
CPC .... H10D 30/014; H10D 30/024; H10D 30/62; H10D 30/6211; H10D 30/6212;
(Continued)

(56) References Cited

U.S. PATENT DOCUMENTS 8,618,607 B1 * 12/2013 Rashed ................ H10D 84/907 257/E23.152
9,831,272 B2 11/2017 Chen et al.
(Continued)

FOREIGN PATENT DOCUMENTS

CN 105608243 B 7/2019
KR 10-2360212 B1 2/2022

*Primary Examiner* — David C Spalla
(74) *Attorney, Agent, or Firm* — Myers Bigel, P.A.

(57) ABSTRACT

Provided is a three-dimensional stacked (3D-stacked) semiconductor device which includes: a lower active region divided into a lower-1$^{st}$ active sub-region and a lower-2$^{nd}$ active sub-region by at least one lower boundary gate structure; and an upper active region, above the lower active region, divided into an upper-1$^{st}$ active sub-region and an upper-2$^{nd}$ active sub-region by at least one upper boundary gate structure, wherein at least one of the lower boundary gate structure and the upper boundary gate structure is reverse-biased to electrically isolate the lower-1$^{st}$ active sub-region from the lower-2$^{nd}$ active sub-region, and/or electrically isolate the upper-1$^{st}$ active sub-region from the upper-2$^{nd}$ active sub-region

20 Claims, 5 Drawing Sheets

(51) Int. Cl.

| | |
|---|---|
| ***H01L 27/06*** | (2006.01) |
| ***H01L 27/088*** | (2006.01) |
| ***H01L 29/08*** | (2006.01) |
| ***H01L 29/786*** | (2006.01) |
| ***H10D 30/67*** | (2025.01) |
| ***H10D 62/10*** | (2025.01) |
| ***H10D 62/13*** | (2025.01) |
| ***H10D 84/83*** | (2025.01) |
| ***H10D 88/00*** | (2025.01) |
| ***H10W 20/20*** | (2026.01) |

(52) U.S. Cl.
CPC ........... *H10D 84/834* (2025.01); *H10D 88/00* (2025.01); *H10W 20/20* (2026.01)

(58) Field of Classification Search
CPC ........... H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 84/013; H10D 84/0158; H10D 84/017; H10D 84/0193; H10D 84/834; H10D 84/853; H10D 88/00; H10D 89/10; H10W 20/20
See application file for complete search history.

(56) References Cited

U.S. PATENT DOCUMENTS

| | | | | |
|---|---|---|---|---|
| 9,960,231 | B2 | 5/2018 | Chen et al. | |
| 10,700,065 | B2 | 6/2020 | Alptekin et al. | |
| 11,101,267 | B2 | 8/2021 | Lim et al. | |
| 2014/0264610 | A1* | 9/2014 | Yang .................... | H01L 21/765 438/283 |
| 2016/0071848 | A1* | 3/2016 | Sengupta ............ | H10D 84/834 438/283 |
| 2020/0212038 | A1 | 7/2020 | Rachmady et al. | |
| 2021/0319164 | A1 | 10/2021 | Liebmann | |
| 2022/0058331 | A1 | 2/2022 | Lim et al. | |

* cited by examiner

30A
M1(Vss)
325A1
325A2
326
325D
325A3
325A4
320
317
315A4
306
305
310
315A3
315D
316
315A1
315A2
C1
C2
D3
D2
D1

Figure 5:
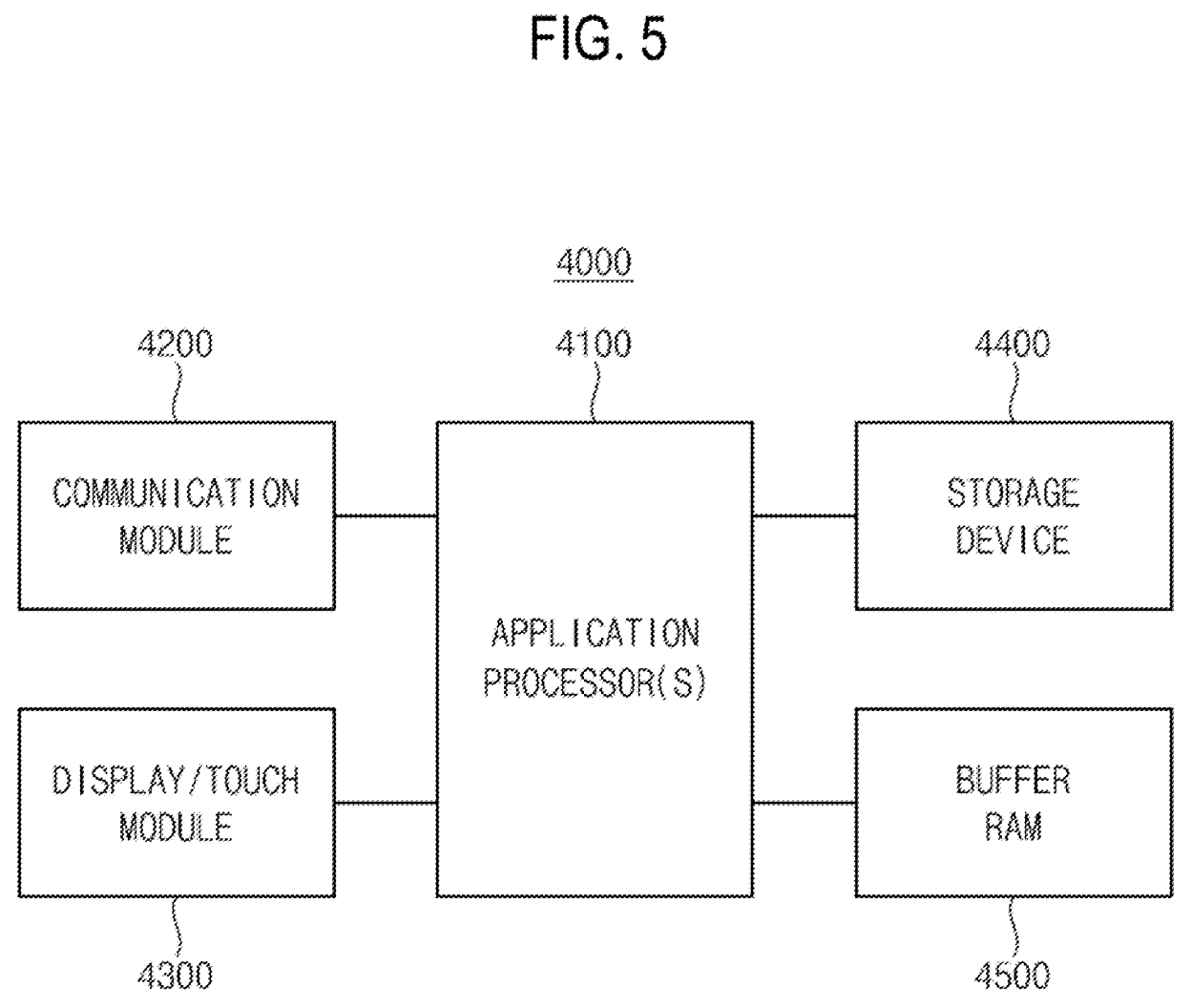

4100 APPLICATION PROCESSOR(S)

4200 COMMUNICATION MODULE

4300 DISPLAY/TOUCH MODULE

4400 STORAGE DEVICE

4500 BUFFER RAM

BOUNDARY GATE STRUCTURE FOR DIFFUSION BREAK IN 3D-STACKED SEMICONDUCTOR DEVICE

CROSS-REFERENCE TO THE RELATED APPLICATION

This application is based on and claims priority from U.S. Provisional Application Nos. 63/335,081 filed on Apr. 26, 2022 in the U.S. Patent and Trademark Office, the disclosure of which is incorporated herein in its entirety by reference.

BACKGROUND

1. Field

Apparatuses and methods according to embodiments relate to a three-dimensionally-stacked (3D-stacked) or multi-stack semiconductor device including at least one diffusion-break gate structure replacing a conventional diffusion break structure.

2. Description of the Related Art

As demand for an integrated circuit having a high device density grows, a 3D-stacked semiconductor device in which two or more field-effect transistors are vertically stacked has been introduced. The field-effect transistors in the 3D-stacked semiconductor device may be fin-field-effect transistors (FinFETs), nanosheet transistors, a combination thereof, etc. The FinFET is well known by a channel structure formed of one or more fin structures which are vertically protruded, horizontally arranged and surrounded by a gate structure, and the nanosheet transistor is characterized by a channel structure formed of one or more nanosheet channel layers which are vertically stacked and surrounded by a gate structure. The nanosheet transistor is referred to as gate-all-around (GAA) transistor, multi-bridge channel field-effect transistor (MBCFET).

However, the 3D-stacked semiconductor device has various challenges including manufacturing complexity and difficulty at least because of structural elements having a high aspect ratio in the 3D-stacked semiconductor device. The diffusion break structure is one of those structural elements having a high aspect ratio. The diffusion break structure is formed between two active regions of respective transistor structures in a semiconductor device to electrically isolate the active regions from each other. Formation of the diffusion break structure in a 3D-stacked semiconductor device requires deep etching of one or more vertically-stacked gate structures between the adjacent active regions, and filling an isolation structure including silicon oxide or silicon nitride in the etched space.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a 3D-stacked semiconductor device in which a gate structure forms a diffusion break structure thereof.

According to an embodiment, there is provided a 3D-stacked semiconductor device which may include: a lower active region divided into a lower-$1^{st}$ active sub-region and a lower-$2^{nd}$ active sub-region by at least one lower boundary gate structure; and an upper active region, above the lower active region, divided into an upper-$1^{st}$ active sub-region and an upper-$2^{nd}$ active sub-region by at least one upper boundary gate structure, wherein at least one of the lower boundary gate structure and the upper boundary gate structure is reverse-biased to electrically isolate the lower-$1^{st}$ active sub-region from the lower-$2^{nd}$ active sub-region, and/or electrically isolate the upper-$1^{st}$ active sub-region from the upper-$2^{nd}$ active sub-region.

According to an embodiment, there is provided a 3D-stacked semiconductor device which may include: a $1^{st}$ lower transistor and a $1^{st}$ upper transistor thereabove; a $2^{nd}$ lower transistor and a $2^{nd}$ upper transistor thereabove; and at least one lower boundary transistor between the $1^{st}$ and $2^{nd}$ lower transistors, and at least one upper boundary transistor, above the lower boundary transistor, between the $1^{st}$ and $2^{nd}$ upper transistors, wherein at least one of the lower boundary transistor and the upper boundary transistor is deactivated According to an embodiment, there is provided a 3D-stacked semiconductor device which may include: a lower active region surrounded by a plurality of lower gate structures arranged at a predetermined gate pitch; and an upper active region surrounded by a plurality of upper gate structures, respectively above the lower gate structures, arranged at the predetermined gate pitch, wherein at least one of the lower gate structures and the upper gate structures is biased to electrically isolate two source/drain regions, connected by a channel structure surrounded by the at least one gate structure, from each other.

BRIEF DESCRIPTION OF DRAWINGS

Example embodiments of the disclosure will be more clearly understood from the following detailed description taken in conjunction with the accompanying drawings in which:

FIG. 1A illustrates a perspective view of a cell layout of a 3D-stacked semiconductor device including a lower diffusion-break gate structure and an upper diffusion-break gate structure, according to an embodiment;

FIG. 1B illustrates a plan view of the 3D-stacked semiconductor device of FIG. 1A, according to an embodiment;

FIG. 2A illustrates a perspective view of a cell layout of a 3D-stacked semiconductor device including a reverse-biased upper diffusion-break gate structure and a forward-biased lower gate structure therebelow, according to an embodiment;

FIG. 2B illustrates a perspective view of a cell layout of the 3D-stacked semiconductor device of FIG. 2A, in which including a reverse-biased upper diffusion-break gate structure and a non-biased lower gate structure therebelow, according to an embodiment;

FIG. 5 is a schematic block diagram illustrating an electronic device including a 3D-stacked semiconductor device in which at least one diffusion-break gate structure is formed in at least one of a lower stack and an upper stack, according to an embodiment.

DETAILED DESCRIPTION OF EXAMPLE EMBODIMENTS

Figures 3A, 3B:
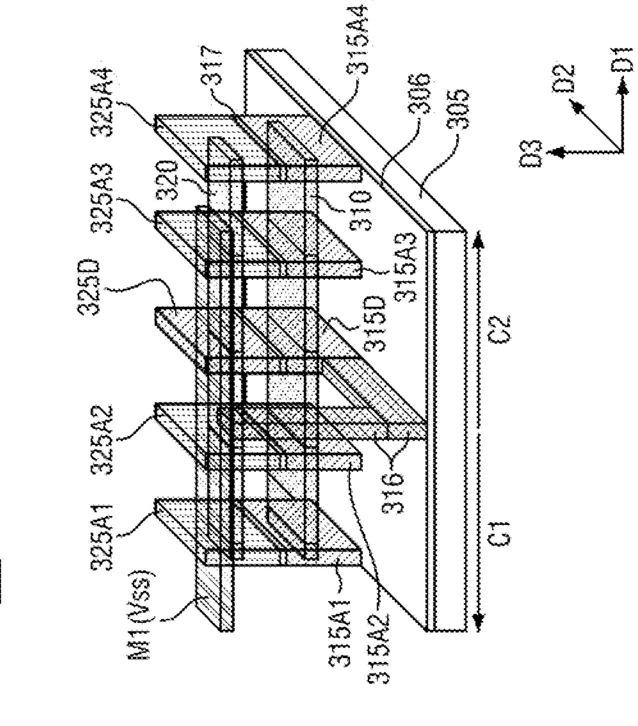
FIG. 3A illustrates a perspective view of a cell layout of a 3D-stacked semiconductor device including a reverse-biased lower diffusion-break gate structure and a forward-biased upper gate structure thereabove, according to an embodiment.
FIG. 3B illustrates a perspective view of a cell layout of the 3D-stacked semiconductor device of FIG. 3A, in which including a reverse-biased lower diffusion-break gate structure and a non-biased upper gate structure thereabove, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, sacrificial isolation layers and channel isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions herebelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a FinFET and a nanosheet transistor may or may not be described in detail herein. For example, a certain isolation layer or structure of a semiconductor device such as an interlayer dielectric (ILD) layer, a shallow trench isolation (STI), a spacer structure, etc. for isolation of an active region and/or a gate structure may be omitted herein when this layer or structure is not related to the various of aspects of the embodiments.

Figures 1A, 1B:
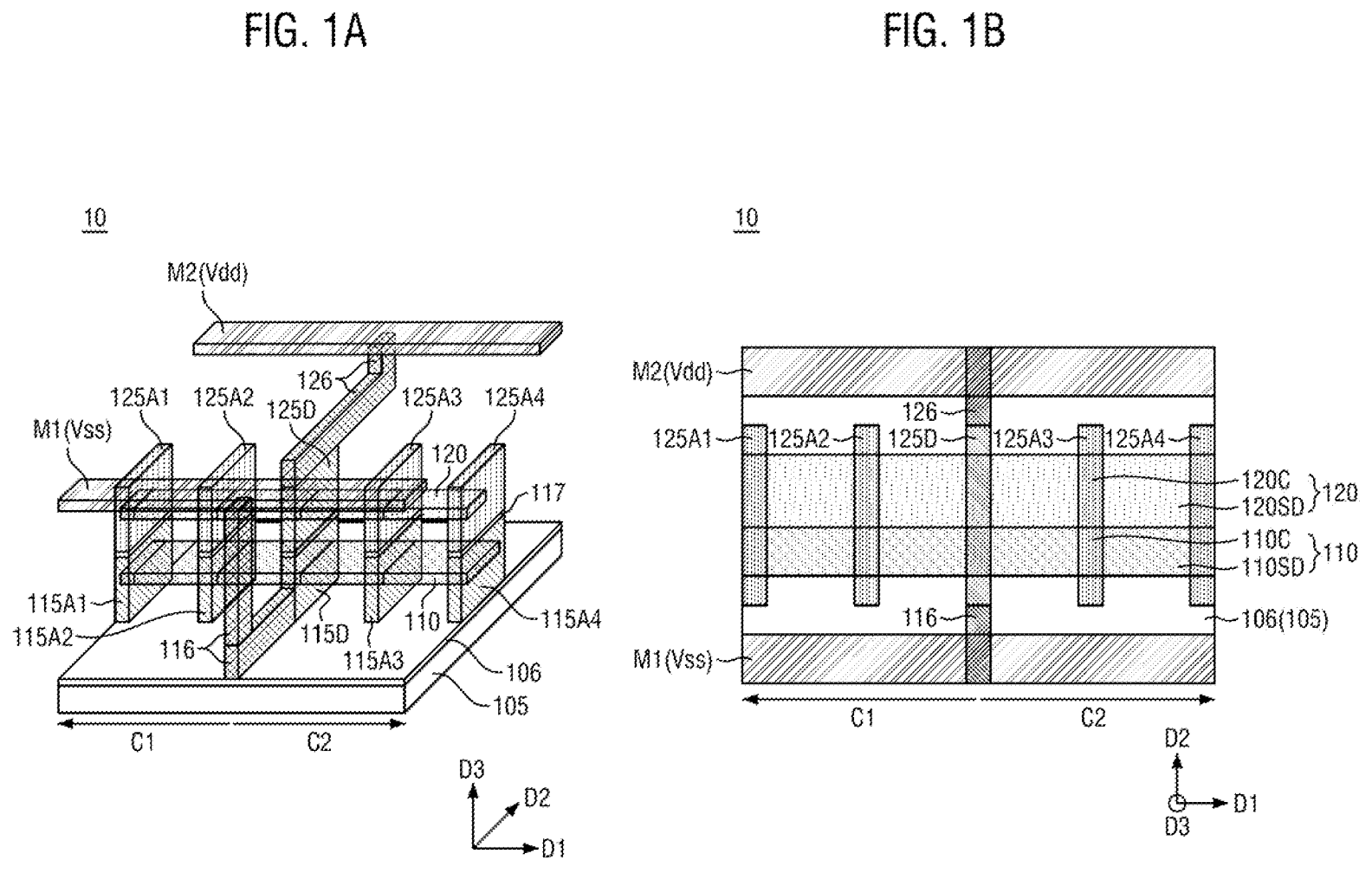

FIG. 1A illustrates a perspective view of a cell layout of a 3D-stacked semiconductor device including a lower boundary gate structure and an upper boundary gate structure, according to an embodiment, and FIG. 1B illustrates a plan view of the 3D-stacked semiconductor device of FIG. 1A, according to an embodiment. It is understood here that FIGS. 1A and 1B are semi-transparent views of the 3D-stacked semiconductor device to better show various structural elements thereof.

Referring to FIGS. 1A and 1B, a 3D-stacked semiconductor device 10 may include a 1$^{st}$ cell C1 and a 2$^{nd}$ cell C2 formed side-by-side above a substrate 105 with a bottom dielectric layer 106 thereon. Each of the 1$^{st}$ cell C1 and the 2$^{nd}$ cell C2 may be a semiconductor cell including at least one lower transistor and at least one upper-stack transistor at a lower stack and an upper stack, respectively, in the 3D-stacked semiconductor device 10. The semiconductor cell may be a logic or non-logic cell or a portion thereof that may include, for example, a CMOS circuit, not being limited thereto.

In a lower stack of the 3D-stacked semiconductor device 10, a lower active region 110 may be extended in a D1 direction across the 1$^{st}$ cell C1 and the 2$^{nd}$ cell C2. The lower active region 110 may take a form of penetrating a plurality of lower gate structures 115 horizontally arranged at a one contacted-poly-pitch (1-CPP) interval in the D1 direction. 1-CPP interval is equivalent to one gate pitch interval. The lower gate structures 115 may include two lower regular gate structures 115A1 and 115A2 in the 1$^{st}$ cell C1, two lower regular gate structures 115A3 and 115A4 in the 2$^{nd}$ cell C2, and a lower boundary gate structure 115D between the lower regular gate structures 115A2 and 115A3.

The lower boundary gate structure 115D may divide the lower active region 110 into a lower-1$^{st}$ (or lower-left) active sub-region in the 1$^{st}$ cell C1 and a lower-2$^{nd}$ (or lower-right) active sub-region in the 2$^{nd}$ cell C2, and electrically isolate these two sub-regions from each other. Thus, the lower boundary gate structure 115D may be referred to as a lower diffusion-break gate structure.

Although, FIGS. 1A and 1B show only four lower regular gate structures and one lower boundary gate structure in the 3D-stacked semiconductor device 10, the number of these lower gate structures are not limited to thereto, and may differ subject to the type of each of the 1$^{st}$ cell C1 and the 2$^{nd}$ cell C2 in the 3D-stacked semiconductor device 10. For example, more or less than two lower regular gate structures may be formed in at least one of the 1$^{st}$ cell C1 and the 2$^{nd}$ cell C2, and more than one lower boundary gate structure may be formed between the 1$^{st}$ cell C1 and the 2$^{nd}$ cell C2.

The lower active region 110 may be formed of a plurality of lower channel structures 110C and a plurality of lower source/drain regions 110SD. The lower channel structures 110C are portions of the lower active region 110 that are surrounded by the lower gate structures 115, and the lower source/drain regions 110SD are the remaining portions of the lower active region 110 that are not surrounded by the lower gate structures 115 and connected to each other by the lower channel structures 110C. In FIGS. 1A and 1B, the lower channel structures 110C and the lower source/drain regions 110SD are connected to each other to form a single continuous structure. However, in reality, the lower source/drain regions 110SD are structures different from the lower channel structures 110C, although they may form a single continuous current path, that is, an active region. The lower source/drain regions 110SD may be formed by removing portions of one single extended lower channel structure that are not surrounded by the lower gate structures 115, and growing lower epitaxial structures from the remaining portions of the single extended lower channel structure that are surrounded by the lower gate structures 115.

Thus, each lower transistor in the 1$^{st}$ cell C1 and the 2$^{nd}$ cell C2 may be formed of one of the lower channel structures 110C, one of the lower regular gate structures 115 surrounding the lower channel structure 110C, and two lower source/drain regions 110SD formed at both ends of the lower channel structure 110C and connected by the lower channel structure 110C. The lower channel structure 110C may form a current path between the lower source/drain regions 110SD under control of the lower regular gate structure 115 in the lower transistor of the 1$^{st}$ cell C1 or the 2$^{nd}$ cell.

In an upper stack of the 3D-stacked semiconductor device 10, an upper active region 120 formed above the lower active region 110 may be extended in a D1 direction in parallel with the lower active region 110 across the 1$^{st}$ cell C1 and the 2$^{nd}$ cell C2. The upper active region 120 may include a plurality of upper channel structures 120C and a plurality of upper source/drain regions 120SD for each of the upper transistors in the 1$^{st}$ cell C1 and the 2$^{nd}$ cell. Also, the upper active region 120 may take a form of penetrating a plurality of upper gate structures 125 respectively formed above the lower gate structures 115 and horizontally arranged a 1-CPP interval in the D1 direction. The upper gate structures 125 may include two upper regular gate structures 125A1 and 125A2 in the 1$^{st}$ cell C1, two upper regular gate structures 125A3 and 125A4 in the 2$^{nd}$ cell C2, and an upper boundary gate structure 125D between the upper regular gate structures 125A2 and 125A3. Similar to the lower gate structures 115, the number of the upper gate structures 125 may not limited thereto. Each of the upper gate structures 125 may be electrically isolated from a lower gate structure 115 therebelow by a gate dielectric layer 117 formed therebetween.

Similar to the lower boundary gate structure 115D, the upper boundary gate structure 125D, referred to as an upper diffusion-break gate structure, may divide the upper active region 120 into an upper-1$^{st}$ (or upper-left) active sub-region in the 1$^{st}$ cell C1 and an upper-2$^{nd}$ (or upper-right) active sub-region in the 2$^{nd}$ cell C2, and electrically isolate these two sub-regions from each other.

As the structural elements in the upper stack of the 3D-stacked semiconductor device 10 including the upper active region 120 and the upper gate structures 125 may be the same as or similar to those in the lower stack of the 3D-stacked semiconductor device 10 described above, duplicate descriptions thereof in their structural and functional aspects are omitted herein.

However, FIGS. 1A and 1B show that a width of the upper active region 120 is smaller than that of the lower active region 110 in the D2 direction, that is, a channel-width direction. The D2 direction may be perpendicular to the D1 direction which is a channel-length direction. Thus, the upper channel structures 120C and the upper source/drain regions 120SD formed based on the upper channel structures 102C may have smaller widths than the lower channel structures 110C and the lower source/drain regions 110SD, respectively. This width difference may provide a vertically non-overlapping region to the 3D-stacked semiconductor device 10 so that a lower source/drain contact plug (not shown) extended down from a back-end-of-line (BEOL) of the 3D-stacked semiconductor device 10 may be connected to a top surface of the lower source/drain region 110SD.

The substrate 105 on which the lower active region 110 and the upper active region 120 are formed may include silicon (Si) or silicon germanium (SiGe), and the lower channel structures 110C epitaxially grown from the substrate 105 may also include silicon or silicon germanium. The lower source/drain regions 110SD epitaxially grown from the lower channel structures 110C and/or the substrate 105 may also include the same or similar material(s) forming the lower channel structures 110C.

In the present embodiment, the lower source/drain regions 110SD may further include one or more n-type dopants such as phosphorous (As), arsenic (Sb), indium (In), etc. to form the lower transistor in each of the 1st cell C1 and the 2nd cell C2 as an NMOS, and the upper source/drain regions 120SD may further include one or more p-type dopants such as boron (B), gallium (Ga), etc. to form the upper transistor in each of the 1st cell C1 and the 2nd cell C2 as a PMOS.

Each of the lower and upper gate structures 115 and 125 may include a gate dielectric layer surrounding the corresponding channel structure, a work-function metal layer on the gate dielectric layer, and a gate electrode pattern on the work-function metal layer. The gate dielectric layer may include silicon oxide, silicon oxynitride, a hafnium oxide layer, etc. The work-function metal layer may include titanium (Ti), tantalum (Ta) or their compound, and the gate electrode pattern may include tungsten (W), ruthenium (Ru), molybdenum (Mo), cobalt (Co), aluminum (Al), copper (Cu), polycrystalline silicon, doped-polycrystalline silicon or their compound, not being limited thereto.

However, the work-function metal layer of the lower gate structure 115 for the NMOS may be formed of a material or material compound such as titanium nitride (TiN) and titanium carbide (TiC) while the work-function metal layer of the upper gate structure 125 for the PMOS may be formed of a material or material compound such as TiN without a carbon component. Alternatively or additionally, the lower gate structure 115 and the upper gate structure 125 may have respective work-function metal layers having different dimensions (e.g., thickness). The gate electrode pattern included in each of the lower gate structures 115 and the upper gate structures 125 may be formed of tungsten (W), ruthenium (Ru), molybdenum (Mo), cobalt (Co), aluminum (Al), copper (Cu), polycrystalline silicon, doped-polycrystalline silicon or their compound, not being limited thereto.

As described earlier, the lower and upper boundary gate structures 115D and 125D may electrically isolate the 1st cell C1 and the 2nd cell C2 from each other. Thus, the lower and upper boundary gate structures 115D and 125D may function as a single diffusion break structure in the 3D-stacked semiconductor device 10.

According to an embodiment, the lower boundary gate structure 115D may be connected to a negative voltage source (Vss) through a lower gate contact plug 116 and a 1st metal line M1. As the lower boundary gate structure 115D is biased to Vss, n-type dopant diffusion or current flow may be prevented or minimized between the lower source/drain regions 110SD with the n-type dopants at two opposite sides of the lower boundary gate structure 115D. Thus, a boundary NMOS formed of the lower boundary gate structure 115D, the lower channel structure 110C surrounded by the lower boundary gate structure 115D, and the lower source/drain regions 110SD connected by the lower channel structure 110C may be deactivated in the lower stack of the 3D-stacked semiconductor device 10. At this time, the lower regular gate structure 115A2 may be connected to a positive voltage source (Vdd) so that an NMOS formed of the lower regular gate structure 115A2, the lower channel structure 110C surrounded by the lower regular gate structure 115A2, and the lower source/drain regions 110SD connected by the lower channel structure 110C may be activated, although not shown in FIGS. 1A and 1B.

In contrast, according to an embodiment, the upper boundary gate structure 125D may be connected to Vdd through an upper gate contact plug 126 and a 2nd metal line M2. As the upper boundary gate structure 125D is biased to Vdd, p-type dopant diffusion or current flow may be prevented or minimized between the upper source/drain regions 120SD with the p-type dopants at two opposite sides of the upper boundary gate structure 125D. Thus, a boundary PMOS formed of the upper boundary gate structure 125D, the upper channel structure 120C surrounded by the upper boundary gate structure 1215D, and the upper source/drain regions 120SD connected by the upper channel structure 120C may be deactivated in the upper stack of the 3D-stacked semiconductor device 10. At this time, the upper regular gate structure 125A2 may be connected to Vss so that a PMOS formed of the upper regular gate structure 125A2, the upper channel structure 120C surrounded by the upper regular gate structure 125A2, and the upper source/drain regions 120SD connected by the upper channel structure 120C may be activated, although not shown in FIGS. 1A and 1B.

Thus, by simply reverse-biasing the lower and upper boundary gate structures 115D and 125D by connecting them to Vss and Vdd, respectively, a single diffusion break structure may be implemented in the 3D-stacked semiconductor device 10. Accordingly, the 3D-stacked semiconductor device 10 may dispense with lower and upper diffusion break structures that require difficult and complicated formation steps including removal of portions of lower and upper channel structures though high-aspect-ratio deep etching and deposition of insulation materials in the etched space.

Referring back to FIGS. 1A and 1B, the bottom dielectric layer 106 may be formed on the substrate below the lower gate structures 115 including the lower boundary gate structure 115D. The bottom dielectric layer 106 may prevent possible current leakage that may be generated from at least one of the lower active region 110 and the lower gate structures 115 including the lower boundary gate structure 115D.

In the above embodiments, both of the lower and upper boundary gate structures 115SD and 125SD may be reverse-biased to deactivate the corresponding NMOS and PMOS. However, according to embodiments, one of the lower and upper boundary gate structures 115SD and 125SD may forward-biased or not biased while the other is reverse-biased to deactivate only one of the corresponding NMOS and PMOS as described below.

Figures 2A, 2B:
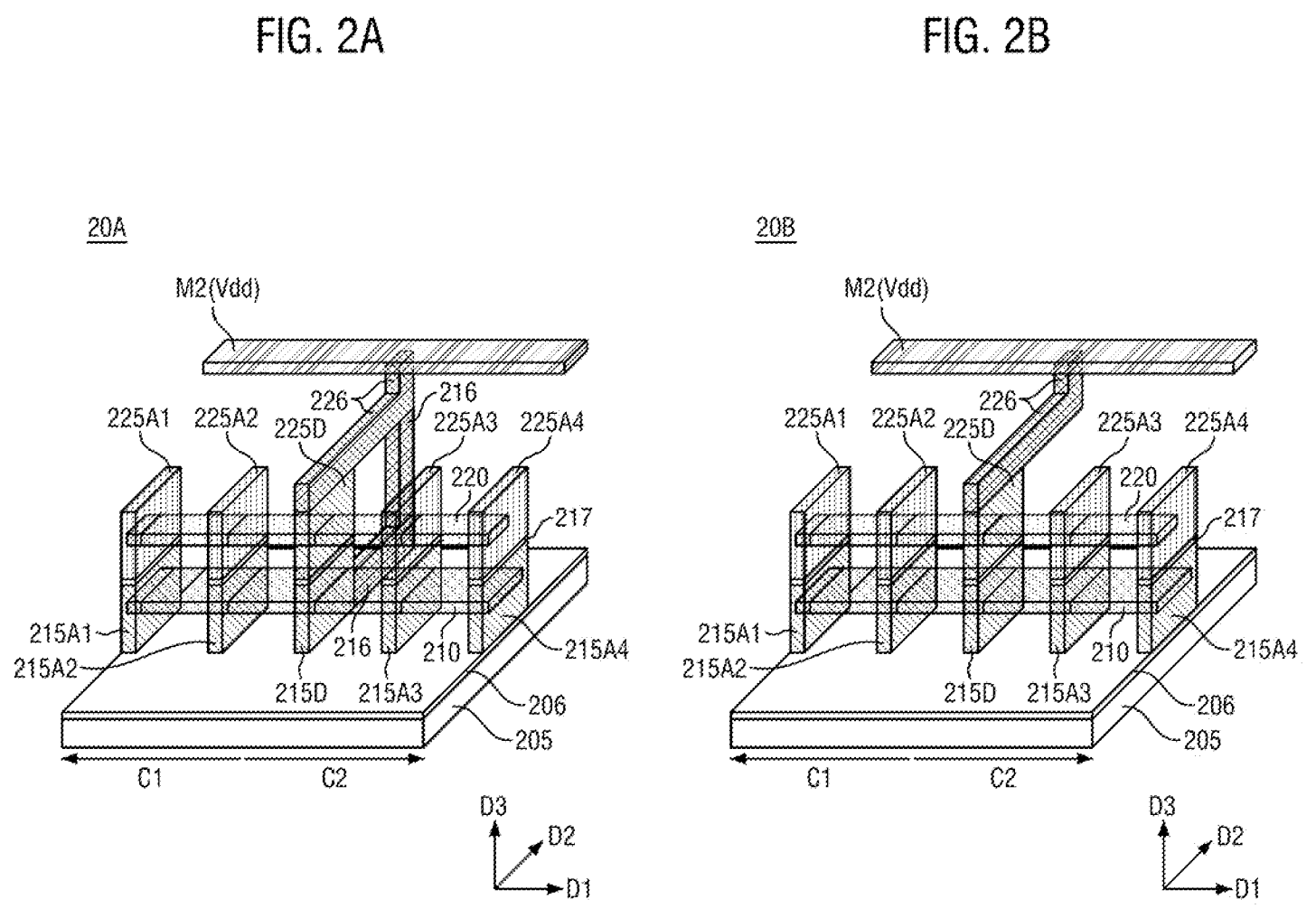

FIG. 2A illustrates a perspective view of a cell layout of a 3D-stacked semiconductor device including a reverse-biased upper boundary gate structure and a forward-biased lower boundary gate structure therebelow, according to an embodiment. FIG. 2B illustrates a perspective view of a cell layout of the 3D-stacked semiconductor device of FIG. 2A including a reverse-biased upper diffusion-break gate structure and a non-biased lower gate structure therebelow, according to an embodiment.

Referring to FIG. 2A, a 3D-stacked semiconductor device 20A may include the same structural elements as those included in the 3D-stacked semiconductor device 10 shown in FIGS. 1A and 1B, except a lower gate contact plug 216. Thus, descriptions of the following structural elements of the 3D-stacked semiconductor device 20A may be omitted herein for brevity purposes: a lower substrate 205 with a bottom dielectric layer 206 thereon, lower and upper active regions 210 and 220, lower and upper gate structures 215 and 225 respectively including lower regular gate structures 215A1 to 215A4 and 225A1 to 225A2 and lower and upper boundary gate structures 215D and 225D, 1st and 2nd metal lines M1 and M2, and an upper gate contact plug 226.

In the present embodiment, the lower gate contact plug 216 may be connected to not the 1st metal line M1 (Vss) but the upper gate contact plug 126 which is connected to the 2nd metal line M2 (Vdd) so that the lower boundary gate structure 215D may not be reverse-biased, while the upper boundary gate structure 225D may be reverse-biased. Thus, only the upper boundary gate structure 225D among the lower and upper boundary gate structures 215D and 225D may function as a diffusion-break gate structure in the 3D-stacked semiconductor device 20A.

In contrast, FIG. 2B shows that a 3D-stacked semiconductor device 20B have the same structural elements as those of the 3D-stacked semiconductor device 20A except that the lower gate contact plug 216 is not formed in the 3D-stacked semiconductor device 20B. In this embodiment, the lower boundary gate structure 215D may not be connected to any of Vss and Vdd. Instead, the lower boundary gate structure 215D may be connected to another circuit element for internal routing in an integrated circuit including the 3D-stacked semiconductor device 20B. Thus, the lower gate contact plug 216 formed in the 3D-stacked semiconductor device 20A may not be required or necessary in the 3D-stacked semiconductor device 20B.

FIG. 3A illustrates a perspective view of a cell layout of a 3D-stacked semiconductor device including a reverse-biased lower boundary gate structure and a forward-biased upper boundary gate structure thereabove, according to an embodiment. FIG. 3B illustrates a perspective view of a cell layout of the 3D-stacked semiconductor device of FIG. 3A including a reverse-biased lower diffusion-break gate structure and a non-biased upper gate structure thereabove, according to an embodiment.

Referring to FIG. 3A, a 3D-stacked semiconductor device 30A may include the same structural elements as those included in the 3D-stacked semiconductor device 10 shown in FIGS. 1A and 1B, except an upper gate contact plug 326. Thus, descriptions of the following structural elements of the 3D-stacked semiconductor device 30A may be omitted herein for brevity purposes: a lower substrate 305 with a bottom dielectric layer 306 thereon, lower and upper active regions 310 and 320, lower and upper gate structures 315 and 325 respectively including lower regular gate structures 315A1 to 315A4 and 325A1 to 325A2 and lower and upper boundary gate structures 315D and 325D, 1$^{st}$ and 2$^{nd}$ metal lines M1 and M2, and a lower gate contact plug 316.

In the present embodiment, the upper gate contact plug 326 may be connected to not the 2$^{nd}$ metal line M2 (Vdd) but the lower gate contact plug 316 which is connected to the 1$^{st}$ metal line M1 (Vss) so that the upper boundary gate structure 325D may not be reverse-biased, while the lower boundary gate structure 315D may be reverse-biased. Thus, only the lower boundary gate structure 315D among the lower and upper boundary gate structures 315D and 325D may function as a diffusion-break gate structure in the 3D-stacked semiconductor device 30A.

In contrast, FIG. 3B shows that a 3D-stacked semiconductor device 30B have the same structural elements as those of the 3D-stacked semiconductor device 30A except that the upper gate contact plug 326 is not formed in the 3D-stacked semiconductor device 30B. In this embodiment, the upper boundary gate structure 325D may not be connected to any of Vss and Vdd. Instead, the upper boundary gate structure 325D may be connected to another circuit element for internal routing in an integrated circuit including the 3D-stacked semiconductor device 30B. Thus, the upper gate contact plug 326 formed in the 3D-stacked semiconductor device 30A may not be required or necessary in the 3D-stacked semiconductor device 30B.

In the above embodiments, both of the metal lines M1 and M2 are formed above the lower and upper gate structures, that is, in the BEOL of a corresponding 3D-stacked semiconductor device. However, in order to enhance device density when at least one additional gate contact plug is required to connect at least one of the lower and upper boundary gate structures to Vdd and/or Vss, at least one of the metal lines M1 and M2 may be formed at a back side of the 3D-stacked semiconductor device.

Figure 4:
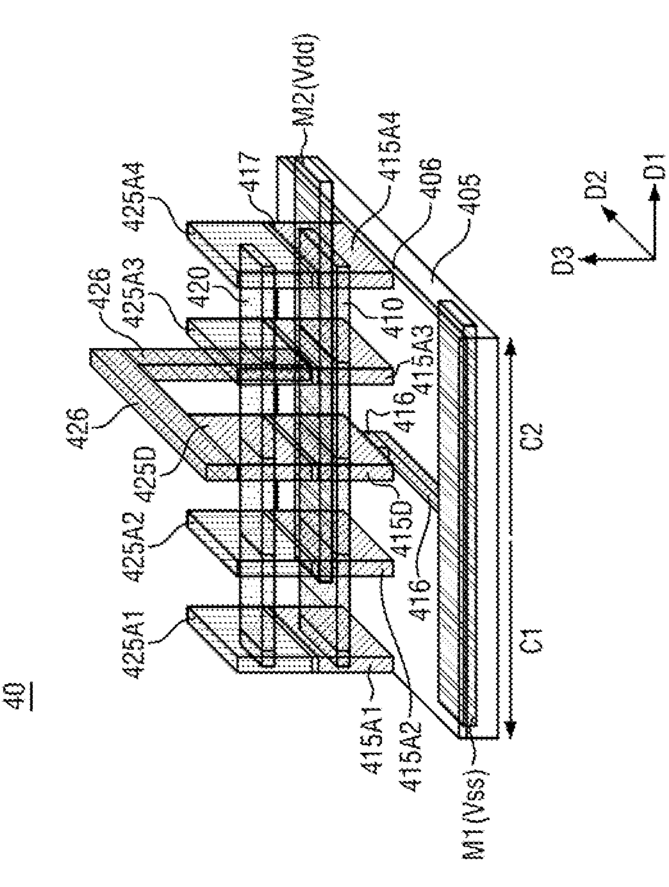
FIG. 4 illustrates a perspective view of a cell layout of a 3D-stacked semiconductor device including at least one diffusion-break gate structure connected to a back side of the 3D-stacked semiconductor device, according to an embodiment.

FIG. 4 illustrates a perspective view of a cell layout of a 3D-stacked semiconductor device including at least one boundary gate structure connected to a back side of the 3D-stacked semiconductor device, according to an embodiment.

Referring to FIG. 4, a 3D-stacked semiconductor device 40 may include the same structural elements as those included in the 3D-stacked semiconductor device 10 shown in FIGS. 1A and 1B, except 1$^{st}$ and 2$^{nd}$ metal lines M1 and M2, and lower and upper gate contact plugs 416 and 426. Thus, descriptions of the following structural elements of the 3D-stacked semiconductor device 40 may be omitted herein for brevity purposes: a substrate 405 with a bottom dielectric layer 406 thereon, lower and upper active regions 410 and 420, and lower and upper gate structures 415 and 425 respectively including lower regular gate structures 415A1 to 415A4 and 425A1 to 425A2 and lower and upper boundary gate structures 415D and 425D.

In the present embodiment, 1$^{st}$ and 2$^{nd}$ metal lines M1 and M2 may be formed at a back side of the 3D-stacked semiconductor device 40, for example, below a level of a top surface of the substrate 405 or below the lower active region 410 when the substrate 405 is replaced with an interlayer dielectric (ILD) layer surrounding the 1$^{st}$ and 2$^{nd}$ metal lines M1 and M2.

Similar to the 3D-stacked semiconductor device 10 shown in FIGS. 1A and 1B, the 1$^{st}$ and 2$^{nd}$ metal lines M1 and M2 formed at the back side of the 3D-stacked semiconductor device 40 may respectively connect the lower and upper boundary gate structures 415D and 425D to Vss and Vdd through the lower and upper gate contact plugs 416 and 417 so that the lower and upper boundary gate structures 415D and 425D may be deactivated. Thus, although the additional two gate contact plugs 416 and 426 are added to the 3D-stacked semiconductor device 40 to implement the lower and upper boundary gate structures 415D and 425D, device density may not increase at a front side of the 3D-stacked semiconductor device 40 because of the 1$^{st}$ and 2$^{nd}$ metal lines M1 and M2 at the back side of the 3D-stacked semiconductor device 40 forming a back side power distribution network (BSPDN). Likewise, each of the metal lines M1 and M2 illustrated in FIGS. 2A-2B and 3A-3B may also be formed at a back side of the corresponding 3D-stacked semiconductor device.

In the above embodiments described in reference to FIGS. 1A-1B to 4, the lower diffusion-break gate structure and the upper diffusion-break gate structure are formed based on a plurality of NMOSs at a lower stack and a plurality of PMOSs at an upper stack of a corresponding 3D-stacked semiconductor device, respectively. However, the disclosure is not limited thereto, and may extend to a 3D-stacked semiconductor device in which the PMOSs and the NMOSs are formed at the lower stack and the upper stack of the 3D-stacked semiconductor device, respectively, according to embodiments. Further, the disclosure may apply to a 3D-stacked semiconductor device in which both of lower and upper stacks are formed of PMOSs or NMOSs, and thus, both of lower and upper boundary gate structures may be reverse-biased to Vdd or Vss. In this case, the lower boundary gate structure and the upper boundary gate structure may have a common gate electrode pattern connected to one of the Vdd or Vss through a single gate contact structure, according to an embodiment.

In the above embodiments described in reference to FIGS. 1A-1B to 4, a single diffusion-break gate structure is formed in at least one of a lower stack and an upper stack of a corresponding 3D-stacked semiconductor device. However, the disclosure is not limited thereto, and may extend to a 3D-stacked semiconductor device in which more than one diffusion-break gate structure is formed side-by-side in at least one of a lower stack and an upper stack of the 3D-stacked semiconductor device so that performance of active region isolation between two adjacent cells in the 3D-stacked semiconductor device may be further enhanced, according to embodiments.

In the above embodiments described in reference to FIGS. 1A-1B to 4, the upper diffusion-break gate structure is formed vertically above the lower diffusion-break gate structure in a corresponding 3D-stacked semiconductor device. However, the disclosure is not limited thereto, and may extend to a 3D-stacked semiconductor device in which an upper diffusion-break gate structure is formed not vertically above a lower diffusion-break gate structure the 3D-stacked semiconductor device, according to embodiments. In other words, in these embodiments, the upper diffusion-break gate structure may be formed at a position different from the lower diffusion-break gate structure in a channel-length direction.

In the above embodiments, the upper channel structure and the upper source/drain regions have smaller widths than the lower channel structure and the lower source/drain regions, respectively, in the D2 direction (channel-width direction). However, the disclosure is not limited thereto, and may extend to a 3D-stacked semiconductor device in which the upper channel structure has a width greater than or equal to that of the lower channel structure, and each of the upper source/drain regions has a width greater than or equal to that of each of the upper source/drain regions, in the D2 direction.

In the above embodiments, both of the PMOS at the upper stack and the NMOS at the lower stack may be nanosheet transistors or FinFETs. However, the disclosure is not limited thereto, and may extend to a 3D-stacked semiconductor device in which one of the PMOS and the NMOS is a nanosheet transistor while the other is a FinFET.

As described above, the 3D-stacked semiconductor devices 10, 20A, 20B, 30A, 30B and 40 and the 3D-stacked semiconductor devices in the additional embodiments may dispense with lower and upper diffusion break structures that require difficult and complicated formation steps including removal of lower and upper gate structures though high-aspect-ratio deep etching and deposition of insulation materials in the etched space. Instead, the 3D-stacked semiconductor devices according to the above embodiments may simply reverse-bias at least one of the existing lower and upper gate structures to use the reverse-biased gate structure as a diffusion break structure.

FIG. 5 is a schematic block diagram illustrating an electronic device including a 3D-stacked semiconductor device in which at least one diffusion-break gate structure is formed in at least one of a lower stack and an upper stack, according to an embodiment.

Referring to FIG. 5 an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the electronic device 4000 may include a 3D-stacked semiconductor device in which at least one diffusion-break gate structure is formed in at least one of a lower stack and an upper stack as described above for various embodiments.

The foregoing is illustrative of example embodiments and is not to be construed as limiting the disclosure. Although a few example embodiments have been described, those skilled in the art will readily appreciate that many modifications are possible in the above embodiments without materially departing from the disclosure.

What is claimed is:

1. A three-dimensional stacked (3D-stacked) semiconductor device comprising:

a lower active region divided into a lower-$1^{st}$ active sub-region and a lower-$2^{nd}$ active sub-region by a lower boundary gate structure;

a lower gate structure on the lower active region;

an upper active region, on the lower active region, divided into an upper-$1^{st}$ active sub-region and an upper-$2^{nd}$ active sub-region by an upper boundary gate structure; and an upper gate structure on the upper active region, wherein at least one of the lower boundary gate structure and the upper boundary gate structure is reverse-biased to electrically isolate the lower-$1^{st}$ active sub-region from the lower-$2^{nd}$ active sub-region, and/or electrically isolate the upper-$1^{st}$ active sub-region from the upper-$2^{nd}$ active sub-region, wherein the lower gate structure and the lower boundary gate structure have a $1^{st}$-type work function, and wherein the upper gate structure and the upper boundary gate structure have a $2^{nd}$-type work function.

2. The 3D-stacked semiconductor device of claim 1, wherein the upper boundary gate structure is vertically on the lower boundary gate structure.

3. The 3D-stacked semiconductor device of claim 2, wherein the lower active region comprises at least one dopant of a $1^{st}$-type polarity, and the upper active region comprises at least one dopant of a $2^{nd}$-type polarity opposite to the $1^{st}$-type polarity, wherein at least one of the lower boundary gate structure and the upper boundary gate structure is configured to prevent current flow between the lower-$1^{st}$ active sub-region and the lower-$2^{nd}$ active sub-region and/or between the upper-$1^{st}$ active sub-region and the upper-$2^{nd}$ active sub-region.

4. The 3D-stacked semiconductor device of claim 1, wherein the lower boundary gate structure is connected to a $1^{st}$ voltage source of a $1^{st}$-type polarity, and the upper boundary gate structure is connected to a $2^{nd}$ voltage source of a $2^{nd}$-type polarity opposite to the $1^{st}$-type polarity.

5. The 3D-stacked semiconductor device of claim 4, further comprising at least one of:

a $1^{st}$ metal line, through which the lower boundary gate structure is connected to the $1^{st}$ voltage source; and a $2^{nd}$ metal line through which the upper boundary gate structure is connected to the $2^{nd}$ voltage source at a back side of the 3D-stacked semiconductor device which is opposite to a back-end-of-line (BEOL) of the 3D-stacked semiconductor device.

6. The 3D-stacked semiconductor device of claim 1, wherein the upper active region has a smaller width than the lower active region in a channel-width direction.

7. The 3D-stacked semiconductor device of claim 1, wherein the lower active region penetrates the lower boundary gate structure, and the upper active region penetrates the upper boundary gate structure.

8. The 3D-stacked semiconductor device of the claim 7, wherein the lower active region comprises:

a lower channel structure surrounded by the lower boundary gate structure;

a lower-$1^{st}$ source/drain region included in the lower-$1^{st}$ active sub-region; and a lower-$2^{nd}$ source/drain region included in the lower-$2^{nd}$ active sub-region, and wherein the upper active region comprises:

an upper channel structure surrounded by the upper boundary gate structure;

an upper-$1^{st}$ source/drain region included in the upper-$1^{st}$ active sub-region; and an upper-$2^{nd}$ source/drain region included in the upper-$2^{nd}$ active sub-region.

9. The 3D-stacked semiconductor device of claim 1, wherein the lower boundary gate structure and the upper boundary gate structure share a gate electrode pattern connected to a positive voltage source or a negative voltage source.

10. The 3D-stacked semiconductor device of claim 9, wherein the gate electrode pattern is connected to the positive voltage source or the negative voltage source through a single gate contact structure connected to the upper boundary gate structure or the lower boundary gate structure.

11. The 3D-stacked semiconductor device of claim 1, wherein one of the lower boundary gate structure and the upper boundary gate structure is reverse-biased to electrically isolate the lower-$1^{st}$ active sub-region from the lower-$2^{nd}$ active sub-region, or electrically isolate the upper-$1^{st}$ active sub-region from the upper-$2^{nd}$ active sub-region, and wherein the other of the lower boundary gate structure and the upper boundary gate structure is neither forward-biased nor reverse-biased.

12. The 3D-stacked semiconductor device of claim 1, wherein one of the lower boundary gate structure and the upper boundary gate structure is reverse-biased by being connected to a positive voltage source or an negative voltage source, and wherein the other of the lower boundary gate structure and the upper boundary gate structure is not connected to any one of the positive voltage source or the negative voltage source.

13. The 3D-stacked semiconductor device of claim 1, further comprising a metal line formed at a back side of the 3D-stacked semiconductor device, which is opposite to a back-end-of-line (BEOL) of the 3D-stacked semiconductor device, wherein one of the lower boundary gate structure and the upper boundary gate structure is reverse-biased by being connected to a positive voltage source or an negative voltage source through the metal line.

14. A three-dimensional stacked (3D-stacked) semiconductor device comprising:

a $1^{st}$ lower transistor comprising a $1^{st}$ lower gate structure, and a $1^{st}$ upper transistor comprising a $1^{st}$ upper gate structure on the $1^{st}$ lower transistor;

a $2^{nd}$ lower transistor comprising a $2^{nd}$ lower gate structure, and a $2^{nd}$ upper transistor comprising a $2^{nd}$ upper gate structure on the $2^{nd}$ lower transistor; and a lower boundary transistor comprising a lower boundary gate structure between the $1^{st}$ and $2^{nd}$ lower transistors; and an upper boundary transistor comprising an upper boundary gate structure, on the lower boundary transistor, between the $1^{st}$ and $2^{nd}$ upper transistors, wherein the $1^{st}$ lower gate structure, the $2^{nd}$ lower gate structure, and the lower boundary gate structure have a $1^{st}$-type work function, wherein the $1^{st}$ upper gate structure, the 2nd upper gate structure, and the upper boundary gate structure have a $2^{nd}$ -type work function, and wherein at least one of the lower boundary transistor and the upper boundary transistor is deactivated.

15. The 3D-stacked semiconductor device of claim 14, wherein at least one of the lower boundary gate structure and the upper boundary gate structure is biased to a positive polarity or a negative polarity.

16. The 3D-stacked semiconductor device of claim 14, wherein at least one of the lower boundary gate structure and the upper boundary gate structure is connected to a positive voltage source or negative voltage source so that the $1^{st}$ lower transistor is electrically isolated from the $2^{nd}$ lower transistor and/or the $1^{st}$ upper transistor is electrically isolated from the $2^{nd}$ upper transistor.

17. The 3D-stacked semiconductor device of claim 16, wherein a gate structure of at least one of the lower boundary transistor and the upper boundary transistorthe at least one of the lower boundary gate structure and the upper boundary gate structure is biased to a positive polarity or a negative polarity.

18. The 3D-stacked semiconductor device of claim 14, wherein the $1^{st}$ lower transistor, the lower boundary transistor and the $2^{nd}$ lower transistor are of one of a p-type and an n-type, and the lower boundary gate structure is connected to a voltage source of the one of the p-type and the n-type, and wherein the $1^{st}$ upper transistor, the upper boundary transistor and the $2^{nd}$ upper transistor are of the other of the p-type and the n-type, and the upper boundary gate structure is connected to the other of the p-type and the n-type.

19. A three-dimensional stacked (3D-stacked) semiconductor device comprising:

a lower active region surrounded by lower gate structures arranged at a predetermined gate pitch; and an upper active region surrounded by upper gate structures, respectively on the lower gate structures, arranged at the predetermined gate pitch, wherein the lower gate structures have a $1^{st}$-type work function, wherein the upper gate structures have a $2^{nd}$-type work function, and wherein at least one of the lower gate structures and the upper gate structures is biased to electrically isolate two source/drain regions, connected by a channel structure surrounded by the at least one of the lower gate structures and the upper gate structures, from each other.

20. The 3D-stacked semiconductor device of claim 19, further comprising a metal line through which the at least one of the lower gate structures and the upper gate structures is connected to a positive voltage source or a negative voltage source, and wherein the metal line is formed at a back side of the 3D-stacked semiconductor device, which is opposite to a back-end-of-line (BEOL) of the 3D-stacked semiconductor device.

* * * * *